(12) United States Patent
Leas

(10) Patent No.: US 6,980,748 B2
(45) Date of Patent: Dec. 27, 2005

(54) SIGE OR GERMANIUM FLIP CHIP OPTICAL RECEIVER

(75) Inventor: James M. Leas, S. Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 844 days.

(21) Appl. No.: 09/942,823

(22) Filed: Aug. 30, 2001

(65) Prior Publication Data

US 2003/0094699 A1 May 22, 2003

(51) Int. Cl.[7] .............................................. H04B 10/06
(52) U.S. Cl. ..................... 398/202; 398/66; 398/70; 398/71; 398/100; 398/154; 398/155; 398/163; 398/164; 398/168; 398/208; 398/214; 385/14; 385/24; 385/42; 250/227.11; 327/291; 327/293; 327/292; 327/294; 257/184; 257/19; 257/21; 257/22; 257/440; 257/457; 257/43
(58) Field of Search ................................ 398/154, 155, 398/163, 66, 140, 164, 165, 202, 70, 71, 398/100, 168, 208, 214; 385/14, 24, 42; 250/227.11; 327/291, 293, 292, 294; 257/184, 19, 21, 257/22, 440, 457, 43

(56) References Cited

U.S. PATENT DOCUMENTS

| | | | |
|---|---|---|---|
| 5,399,880 A | 3/1995 | Chand | |
| 5,416,861 A | 5/1995 | Koh et al. | |
| 5,442,475 A | 8/1995 | Bausman et al. | |
| 5,508,835 A | 4/1996 | Takahashi et al. | |
| 5,537,498 A | 7/1996 | Bausman et al. | |
| 5,665,423 A | 9/1997 | Lee | |
| 5,747,860 A | 5/1998 | Sugiyama et al. | |
| 5,783,839 A | 7/1998 | Morikawa et al. | |
| 5,838,870 A | 11/1998 | Soref | |
| 5,877,519 A | 3/1999 | Jewell | |
| 5,889,903 A | 3/1999 | Rao | |
| 6,043,517 A * | 3/2000 | Presting et al. | 257/184 |
| 6,477,285 B1 * | 11/2002 | Shanley | 385/14 |

FOREIGN PATENT DOCUMENTS

JP  5-326999  12/1993

* cited by examiner

Primary Examiner—Hanh Phan
(74) Attorney, Agent, or Firm—Whitham, Curtis & Christofferson, P.C.; Joseph P. Abate

(57) ABSTRACT

A synchronized optical clocking signal is provided to a plurality of optical receivers by providing a layer of a high absorption coefficient material, such as SiGe or Ge, on a front surface of a low absorption coefficient substrate, such as silicon. Diodes are formed in the germanium containing layer for receiving an optical signal and converting the optical signal into an electrical signal. An optical clocking signal is shined on the back surface of the silicon substrate. The light has a wavelength long enough so that it penetrates through the silicon substrate to the germanium containing layer. The wavelength is short enough so that the light is absorbed in the germanium containing layer and converted to the electrical clocking signal used for neighboring devices and circuits. The germanium concentration is graded so that minority carriers are quickly swept across junctions of the diodes and collected.

42 Claims, 4 Drawing Sheets

SIGE OR GERMANIUM FLIP CHIP OPTICAL RECEIVER

FIELD OF THE INVENTION

The invention is directed to optical signals for an integrated circuit. More particularly, it is directed to clocking in integrated circuits. Even more particularly, it is directed to providing synchronized clocking signals to circuit components.

BACKGROUND OF THE INVENTION

Computer systems and integrated circuits utilize a system clock signal to control the timing of events. One problem associated with distributing the clock signal is clock skew. Clock skew is the difference in arrival times of clock edges to different parts of a chip. Most conventional digital logic requires precise clocking, and ideal synchronous logic relies on clock signals arriving simultaneously to all. As the computer and integrated circuit industries continue to develop faster and more complex devices, less clock skew can be tolerated.

Clock skew is caused by a number of factors, including the physical length of a path for the clock signal. A typical path will include interconnections between circuit boards, fanout gates, circuit board foil paths, and integrated circuit interconnect metal. In general, a signal will take longer to travel a long path than a short one. Additionally, clock skew is caused by variation in routing impedance of the clock signal distribution in a device.

In computer systems, a clock signal is commonly distributed from a single source to multiple destinations. More complex devices typically have a greater number of destinations and require high performance data processing that operate at high clock frequencies. Clock skew reduces the maximum operating frequency of the circuit because the circuit has to be designed to take into account a worst case clock skew in order to operate reliably. For example, for a 1 GHz clock frequency, or 1 nanosecond cycle time, the tolerable clock skew is typically less than or equal to 100 picoseconds. In the event that clock skew is greater than 100 picoseconds, the sampling window of a register may acquire incorrect data.

Several techniques have been developed to reduce clock skew. System designers have attempted to reduce the variation in the physical length of an electrical path traveled by the clock signal. However, since each path may have a different impedance due to semiconductor manufacturing process variation, for example, the designer has difficulty matching path lengths.

U.S. Pat. No. 5,889,903 ("the '903 patent"), incorporated herein by reference, describes a method and apparatus for distributing an optical clock in an integrated circuit that eliminates clock skew by transmitting an infrared clocking pulse directed at the back surface of a Control Collapse Chip Connection (C4), flip chip, packaged chip. Silicon is partially transparent to infrared, so the optical clocking pulse penetrates through the silicon and is focused into P-N junction diode receivers at the front surface of the integrated circuit. The P-N junction diodes provide the electrical signals for local clocking. The optical clocking pulse is split and focused into an number of similarly configured P-N junctions distributed throughout the chip to provide local clocking so that clock skew is extremely small.

Unfortunately, as the '903 patent points out, only 1–2% of the photons are transmitted through a substrate that is approximately 720 um thick. The '903 patent addresses this problem in one embodiment by locally thinning the bulk silicon extending over the P-N junction receivers. However, this requires aligning, patterning, and other processing steps for both front and back surfaces of the wafer, adding substantially to cost.

Another problem with directing light through the substrate, as described by the '903 patent, is that the electrical conversion of the clocking signal may be blurred if the light passes through a substantial thickness of substrate. Light absorbed in the substrate generates minority carriers that have long lifetimes, for example, in the hundreds of microseconds in single crystal silicon. The minority carriers persist for orders of magnitude longer than the clocking signal. The P-N junctions gradually collect these minority carriers, providing a background noise signal that decreases the signal to noise ratio of the clocking signal. This is particularly a problem if only 1–2% of the optical signal penetrates through the substrate to thin heavily doped regions.

There is also a problem because the minority carrier lifetime is shorter on the heavily doped side of the junction, so that light absorbed there is not as likely to generate minority carriers that diffuse to the junction and contribute to current output of the device. Thus, the noise is high and the signal is low.

However, the technique described by the '903 patent is uniquely suited to C4 packaging technology where the back side of the integrated circuit is exposed. Conventional integrated circuits may have a number of metal interconnect layers on the front surface of a chip that would block optical signals coming from the front. The '903 patent uses front side C4s for connections and avoids shadowing clocking signal reception by directing the clocking signal to the back side of the integrated circuit and through the chip to receivers on the front side.

What is therefore needed is an improvement that more effectively provides synchronized optical clocking signals to a plurality of circuit components on a silicon substrate with minimal signal degradation and a better signal to noise ratio while continuing to avoid shadowing from metal interconnect layers on the front surface of the chip so as to minimize or eliminate clock skew.

SUMMARY OF THE INVENTION

The present invention provides a synchronized clocking signal to a plurality of optical receivers in a low bandgap layer on a higher bandgap substrate. A germanium containing layer, such as SiGe is disposed on a front surface of a silicon substrate in one embodiment. Diodes, such as P-N junction diodes, PIN diodes, or Schottky diodes, are formed in the germanium containing layer. An optical clocking signal is shined on the back surface of the silicon substrate. The light has a wavelength long enough so that it penetrates through the silicon substrate with little absorption. The wavelength is nevertheless short enough so that the light is absorbed in lightly doped portions of the low bandgap germanium containing layer. The minority carriers so generated are collected by the P-N junction diodes to provide an electrical clocking signal for local circuits. The germanium concentration in the germanium containing layer is preferably graded so that minority carriers are quickly swept across the P-N junctions.

In a preferred embodiment, an optical source is used that provides an optical signal having a photon energy in the range between the bandgap of the silicon substrate and the band gap of the SiGe layer to optimize transmission through the silicon substrate and absorption in the SiGe layer. When the optical receivers are adjacent the top surface of the substrate and the light is directed from the bottom surface of the substrate and through the substrate toward the top surface, the present invention avoids shadowing of the optical signal that may be created by the layers of metal interconnect on the top surface. C4, or flip chip, applications, facilitate the optical source being directed at the back surface of the substrate.

These and other objects, features, and advantages of the invention are accomplished by a method for providing an optical signal to an optical receiver. The method includes the step of providing a semiconductor substrate having a first surface and a second surface opposite the first surface. A first semiconductor layer of a first semiconducting material is adjacent the first surface. The first semiconductor layer is on a second semiconductor of a second semiconducting material. The first semiconducting material has a higher absorption coefficient than the second semiconducting material when both the first semiconducting material and the second semiconducting material are undoped. A device is formed in the first semiconductor layer to collect carriers generated by the optical signal. The optical signal is directed at the second surface wherein a portion of the optical signal passes through the second semiconductor, and the portion is absorbed by the first semiconductor material in the first semiconductor layer.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1:
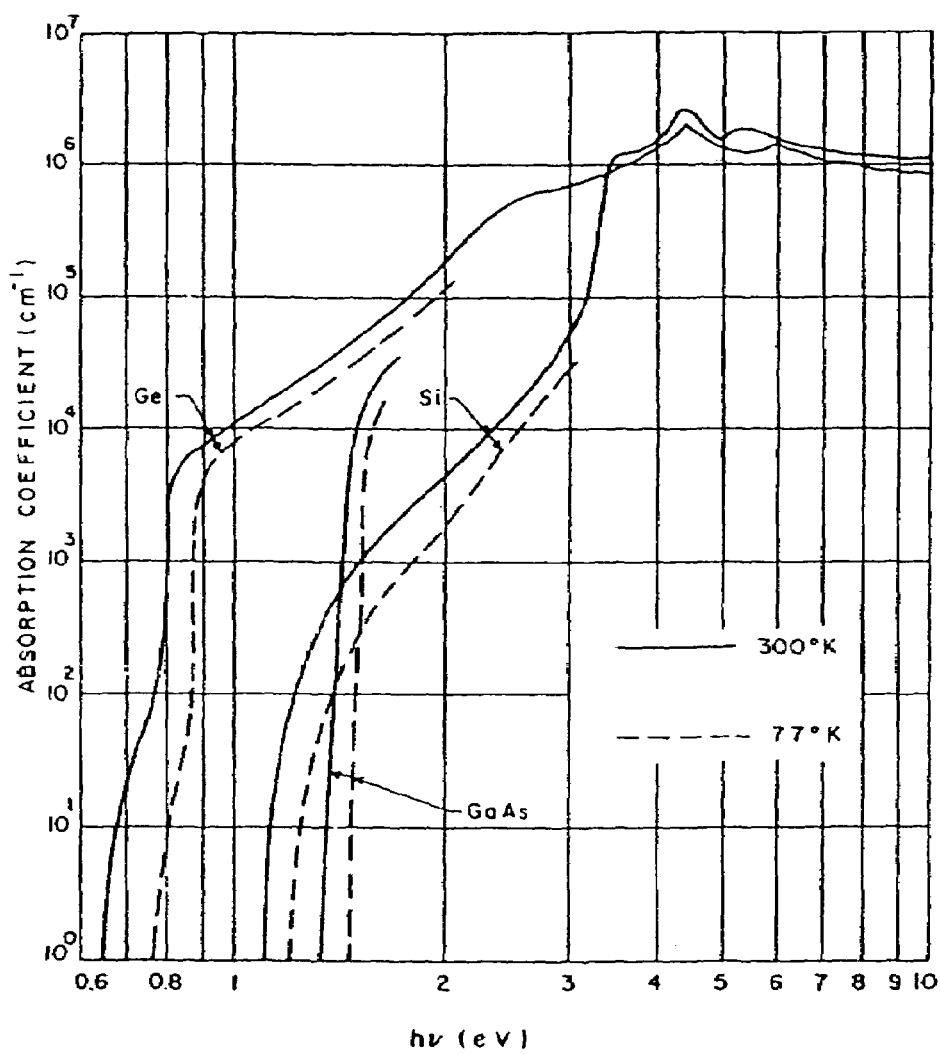
FIG. 1 is a diagram showing the measured absorption coefficients of pure silicon, germanium, and gallium arsenide as a function of optical energy.

The present invention is an improved optical receiver for receiving optical signals in an integrated circuit. Synchronized clocking signals are provided to local circuits on the chip or on many chips with substantially reduced clock skew and with minimal signal degradation while avoiding shadowing by metal interconnect layers on the front surface of the chip. The present invention is particularly suitable for chips mounted face down. In addition to clocking, the present invention is also suitable for providing data, such as digital data for data processing, text, voice, or image to a chip.

A germanium (Ge) containing layer, such as silicon germanium (SiGe), is formed on a semiconductor substrate, such as a silicon (Si) substrate. The germanium containing layer may have a thickness in the range from less than about 0.1 $\mu$m to about 1 $\mu$m. Thicker layers can also be formed to absorb more light. The germanium concentration may be graded by gradually increasing the concentration of germanium during the epitaxial growth process, as is well known in the art. A germanium containing layer has a band gap that is up to 0.46 eV smaller than the bandgap of silicon, so a long wavelength optical signal that passes through the silicon substrate with minimal signal loss is readily absorbed by the SiGe or germanium layer. At room temperature the bandgap of silicon is 1.12 eV and for germanium the bandgap is 0.66 eV. SiGe has an intermediate bandgap, varying with the germanium concentration. Because of the large difference in bandgap the optical signal can more readily penetrate through the silicon substrate for absorption in the germanium containing layer.

The present invention has the advantage of providing optical clocking signals at very high clocking rates to provide electrical clocking signals distributed around the chip. Clock skew is minimized or eliminated because an optical clocking signal is received by all these devices on the chip at almost the same time and the devices can operate at a very high data rate.

In a most basic embodiment of the present invention, a top layer of a high absorption coefficient semiconductor, such as germanium, graded SiGe, amorphous germanium, or amorphous silicon, is formed on a surface of a low absorption coefficient semiconductor substrate, such as silicon. The top layer of low bandgap and high absorption coefficient semiconductor contains optical receivers, such as P-N junction diodes, PIN diodes, and Schottky diodes. Other types of optical receivers, including transistor optical receivers, are well known in the art. Optical clocking signals are directed at a bottom surface of the silicon substrate and are transmitted through the silicon substrate toward the germanium containing layer at the top surface. A wavelength for the light is selected such that the silicon semiconductor of the substrate, with its higher band gap, is substantially transparent to the wavelength of the light while the top SiGe or germanium layer, with its smaller band gap, can absorb that wavelength of light.

In a preferred embodiment, the germanium concentration in the SiGe layer is graded such that any minority carriers that are generated by absorption of the optical clocking signal 111, 207a, 207b in the germanium containing layer 221a, 221b are quickly swept toward and across the junction of a P-N diode 217a, 217b. Graded SiGe can be grown on the silicon substrate. FIG. 1 is a diagram showing known measured absorption coefficients of pure silicon, germanium, and gallium arsenide as a function of optical energy, and is based on FIG. 27 on page 54 of *Physics of Semiconductor Devices* by S. M. Sze. As shown in FIG. 1, the absorption coefficient of germanium is at least four orders of magnitude higher than the absorption coefficient of silicon for light having energy in the range from 0.9 eV to 1.1 eV. A one micron thick film of germanium will absorb at least as much of the light in this wavelength range, 0.9 eV to 1.1 eV, as more than a one centimeter thickness of silicon. Thus, a thin layer of SiGe or Ge can be used in accordance with the present invention. For sufficiently energetic light, germanium has direct bandgap transitions while silicon has an indirect bandgap transition, and this accounts for the large difference in absorption coefficients between silicon and germanium in the 0.9 to 1.1 eV range. A high efficiency of absorption of light in the germanium containing layer on silicon, in accordance with the present invention, is therefore possible for light penetrating through the back side of a silicon chip, and the higher the germanium concentration in the SiGe, the more strongly the layer is absorbing compared to silicon.

Other semiconductor combinations of low bandgap material on high bandgap material can be used, such as GaSb on silicon or GaSb on GaAs or germanium on GaAs. Further advantage is obtained if the top layer is provided of a direct bandgap material having a small bandgap, such as GaSb and InAs, so that more of the light is absorbed in a thin layer. Amorphous materials, such as amorphous silicon, which has a very high absorption coefficient compared to crystalline silicon, can also be used for the top layer. By providing a higher absorption coefficient material for the top layer than for the substrate, a wavelength of light can be selected that penetrates through the substrate and is strongly absorbed in the top layer.

Although doped semiconductors may be used in the actual devices, the absorption coefficients and band gaps of the two semiconductor materials are more accurately compared when the two semiconductors are both undoped pure materials (intrinsic semiconductors) since absorption coefficient and band gap generally depend on doping. In the present invention, the two materials have different absorption coefficients for the intrinsic, or high-purity, materials. This difference may be the result of different band gaps, band structure, or absorption mechanism.

Figure 2:
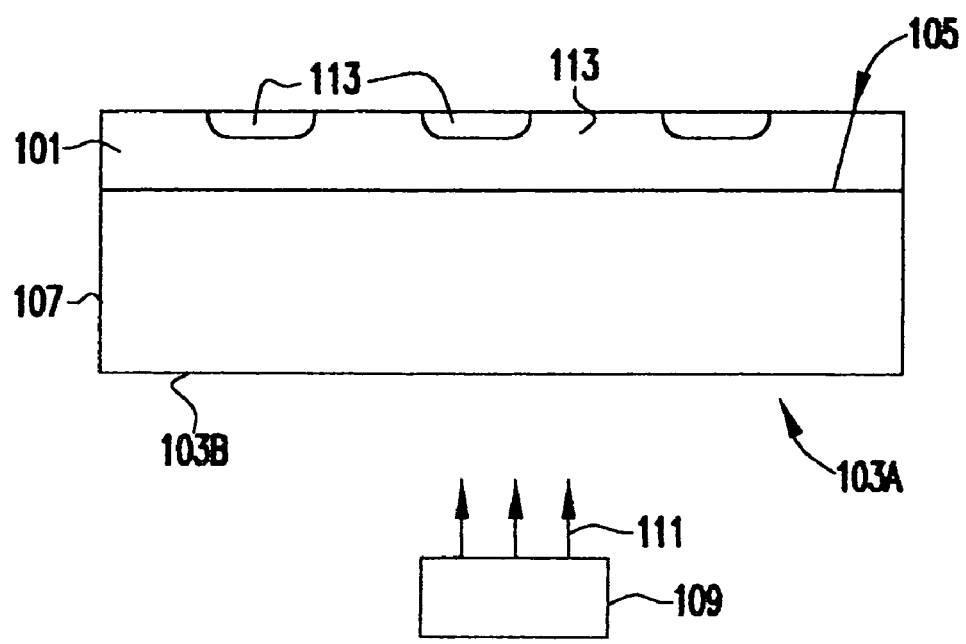
FIG. 2 is a cross sectional diagram of an optical clocking signal transmitted into a SiGe layer through a back side of a silicon substrate in accordance with the present invention.

FIG. 2 is a diagram of an optical clocking signal transmitted into a SiGe layer 101 through a back side, shown generally at 103a, of a silicon substrate 107 in accordance with the present invention. An optical clocking source 109, such as a laser or light emitting diode, directs optical clocking signals 111 at a back surface 103b of the silicon substrate 107. Devices 113, such as P-N junction diodes, are disposed in the SiGe layer 101 to collect minority carriers generated by the optical clocking signals 111. The layer of germanium or SiGe 101 is formed on a front surface 105 of the silicon substrate 107. Other devices and circuits (not shown) may be located on the top surface along with devices 113, such as field effect transistors, bipolar transistors, pn diodes, and logic or memory circuits. Some of these may be formed in SiGe layer 101. Spaces in that layer may be provided so they may be formed in silicon substrate 107.

In one embodiment of the present invention, the optical clocking source 109 is an infrared laser that generates and emits infrared laser pulses at a desired clock frequency to provide the optical clock signals 111. The laser pulses are directed at the back side 103a of the silicon substrate 107 towards the front surface 105 of the substrate 107. The optical clocking signals 111 preferably have a wavelength that is long enough to allow the signals 111 to pass through the silicon substrate 107 while short enough to be absorbed by the germanium or SiGe layer 101. Optical signal 111 has a photon energy in the range from the band gap of silicon to the band gap of germanium or SiGe, in the infrared range. The energy may vary depending on the germanium concentration in the SiGe and on the concentration of dopants used in the silicon and germanium containing layers. This wavelength range will also be different if another pair of semiconductor materials is selected. A larger difference in band gap allows the wavelength of light selected to be further from the bandgap of the substrate 107 so it is less absorbed there while still being absorbed by the layer 101. The integrated circuit chip may be flip chip mounted to another assembly whereby the back side 103a of the integrated circuit can be exposed to light as shown in FIG. 1. C4s may be used for the flip chip mounting.

Upon absorbing the optical clocking signals 111 that pass through the silicon substrate 107, minority carriers are generated in layer 101. P-N junction diodes 113 collect the minority carriers and produce a photo current and a photo voltage. The photo voltage or the photo current (which can be converted to a voltage using conventional techniques), is used as an electrical clock signal for nearby circuit components. A plurality of layers 101 and devices 113 may be distributed throughout an integrated circuit die to simultaneously receive optical signals 111 and provide electrical clock signals to local circuits on a designated area of the integrated circuit with minimal or no clock skew. Layer 101 and device 113 can also be used to receive other digital or analog data in an optical signal, such as numbers, text, sound, or video data, and convert it to an electrical signal for processing on the chip.

Figure 3:
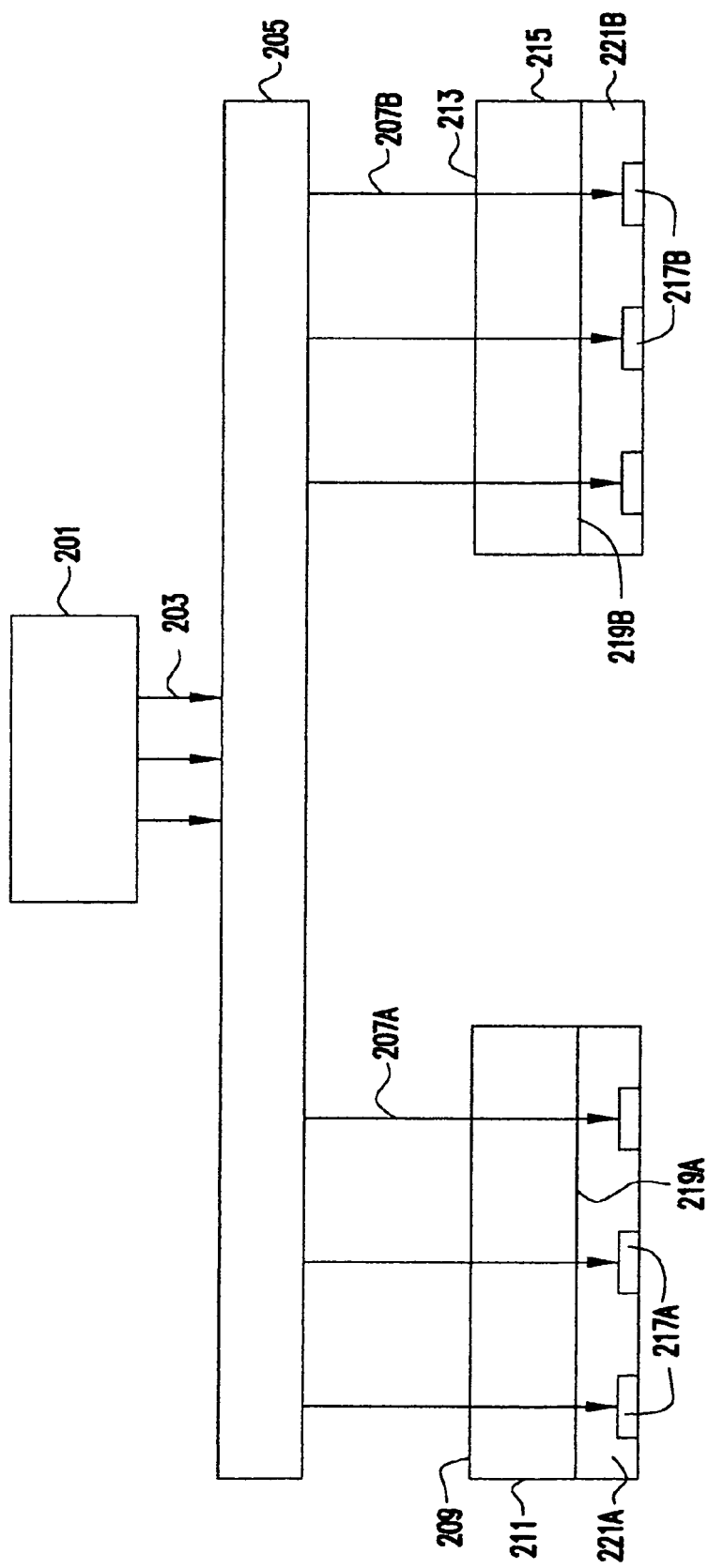
FIGS. 3 and 4 are cross sectional diagrams showing alternate optical distribution systems for use with the invention illustrated in FIG. 2.
Figure 4:
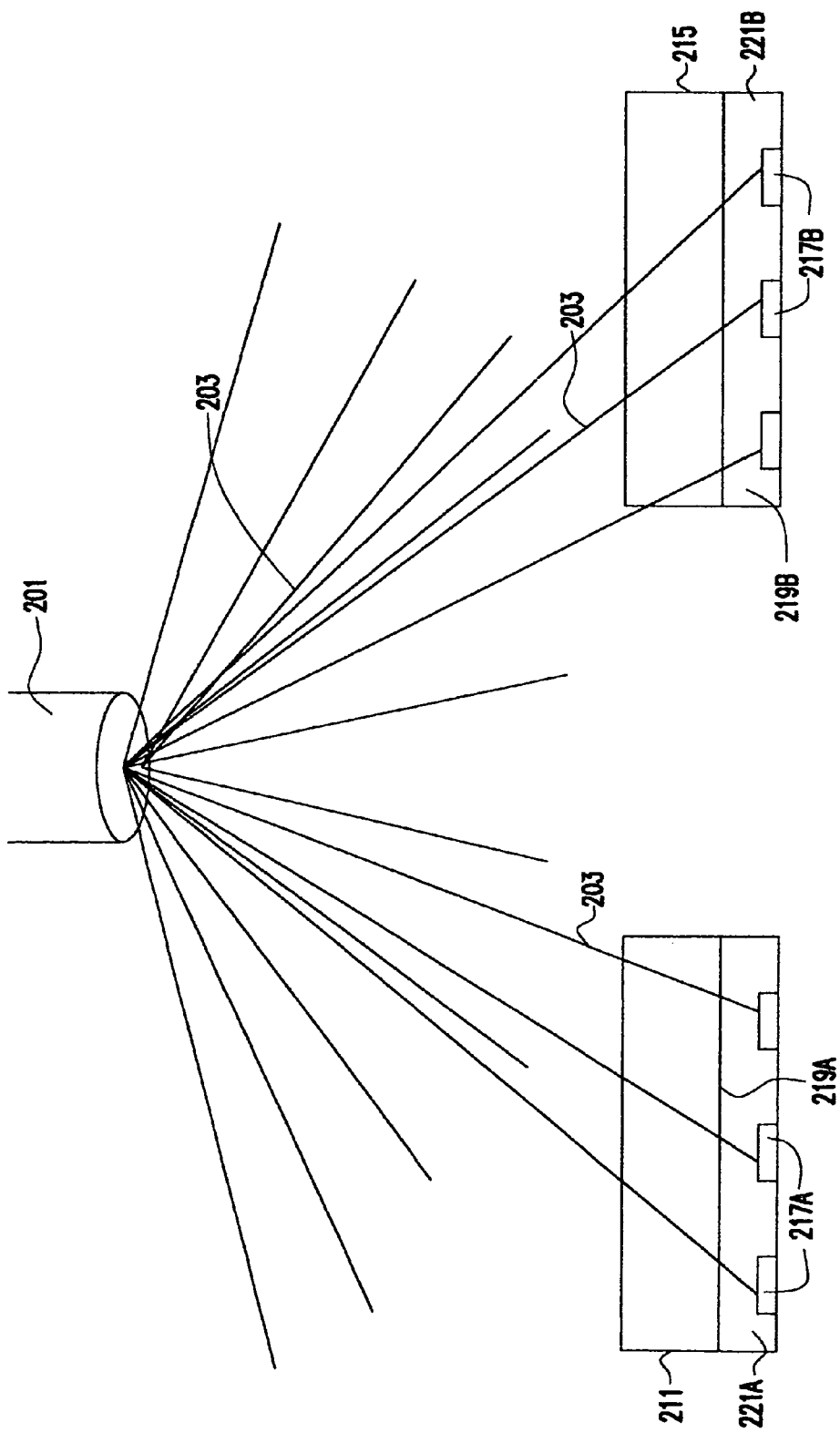

FIGS. 3 and 4 are cross sectional diagrams of optical clocking signal distribution systems in accordance with the present invention. As shown in FIG. 3, an optical clocking source 201 emits optical clocking signals 203 at a predetermined frequency into an optional optics element 205. The optics element 205 may include optical components, such as lenses, mirrors, gratings, or holograms. The optics element 205 may split a single optical signal beam 203 into multiple synchronized optical clocking signals 207a, 207b. The optics element 205 may focus optical clocking signals 207a, 207b onto optical receivers. The optical clocking signals 207a are directed to optical receivers through the back side 209 of a silicon substrate 211. Optical receivers include lower bandgap layer 221a on higher bandgap substrate 211, and device 217a, in layer 221a. In alternative embodiments, the light may be directed from optics elements 205 onto one chip or onto different chips. The integrated circuit chips include layers 221a, 221b and devices 217a, 217b, such as P-N junctions, that generate synchronized electrical clock signals from the light signals. Each chip 211, 215 has a layer 221a, 221b of germanium or SiGe formed on the front side 219a, 219b of the silicon substrate 211, 215. The clocking signals 207a, 207b are directed through the back sides 209, 213 and through multiple silicon substrates 211, 215 to multiple devices 217a, 217b in lower bandgap layers 221a, 221b.

The chips 211, 215 may be different chips of a multi-chip module. The chips 211, 215 can also be on separate modules, on separate boards, or in separate systems. The optical signals can also be used to synchronize chips on separate circuit boards or even in separate information handling systems or for receiving data carrying optical signals.

In FIG. 4, light from optical clocking source 201 shines directly on back sides 209, 213 of multiple silicon substrates 211, 215 without intervening the optics element 205 (FIG. 3).

In addition to providing a low bandgap material for receiving an optical signal, SiGe layer 101, 221a, 221b can also be used for the base of bipolar transistors on the integrated circuit chip. Regions free of the SiGe layer can also be provided for devices, such as FETS, that are fabricated directly in silicon substrate 107, 211, 215. Wiring from devices 113, 217a, 217b can be connected to provide clock signals to these bipolar of FET devices or to circuits using these devices.

While the invention has been described in terms of its preferred embodiments, the invention can be practiced with modification and variation within the spirit and scope of the appended claims.

What is claimed is:

1. A method for providing an optical signal to a semiconductor, comprising the steps of:
   a) providing a semiconductor substrate having a first surface and a second surface opposite said first surface, a first semiconductor layer of a first semiconducting material adjacent said first surface, said first semiconductor layer on a second semiconductor of a second semiconducting material, said first semiconducting material having a higher absorption coefficient than said second semiconducting material when both said first semiconducting material and said second semiconducting material are undoped;

b) forming a device in said first semiconductor layer to collect carriers generated by the optical signal; and c) directing the optical signal at said second surface wherein a portion of said optical signal can pass through said second semiconductor and is absorbed by said first semiconductor material in said first semiconductor layer.

2. The method of claim 1 wherein said optical signal comprises an optical clocking signal.

3. The method of claim 1 wherein said optical signal comprises an optical data signal.

4. The method of claim 3 wherein said optical data signal comprises digital data for data processing, text, graphic, voice, or video.

5. The method of claim 1 wherein said optical signal is absorbed in said first semiconductor layer for generating an electrical signal.

6. The method of claim 1 wherein said first semiconducting material comprises germanium and said second semiconducting material comprises silicon.

7. The method of claim 6 wherein said germanium containing material comprises SiGe.

8. The method of claim 6 wherein said step (a) includes the step of depositing a layer containing germanium, and wherein said step (b) includes the step of forming said device in or on said layer.

9. The method of claim 6 wherein during said step (a) the germanium concentration of the germanium containing layer is graded.

10. The method of claim 1 wherein said first semiconducting material comprises a lower bandgap than said second semiconducting material.

11. The method of claim 1 wherein said first semiconducting material comprises an amorphous material or a direct bandgap material and said second semiconducting material comprises a crystalline material or an indirect bandgap material.

12. The method of claim 1 wherein the energy of said optical signal is in the range from 0.66 eV to 1.12 eV.

13. The method of claim 1 wherein said device is selected from a P-N diode, a PIN diode, a Schottky diode and a transistor.

14. The method of claim 1 wherein said substrate is an integrated circuit chip and wherein a plurality of said devices are distributed around said integrated circuit chip for simultaneously receiving said optical signal.

15. The method of claim 14 wherein said optical signal comprises an optical clocking signal, and wherein said integrated circuit chip further comprises devices or circuits that use said clocking signal when it is converted to an electrical clocking signal.

16. The method of claim 14 further comprising a plurality of integrated circuit chips, wherein each of said integrated circuit chips comprise at least one of said devices and wherein each of said integrated circuit chips are configured to receive said optical signal.

17. The method of claim 16 further comprising a multi chip module containing said plurality of integrated circuit chips, wherein each of said integrated circuit chips comprises at least one of said devices and is configured to receive said optical signal.

18. An opto-electronic system comprising:
a semiconductor substrate having a first surface and a second surface opposite said first surface, a first semiconductor layer of a first semiconductor material adjacent said first surface, said first semiconductor layer on a second semiconductor of a second semiconducting material, said first semiconducting material having a higher absorption coefficient than said second semiconducting material when both said first semiconducting material and said second semiconducting material are undoped;

a device in said first semiconductor layer to collect carriers generated by an optical signal; and an optical transmitter shining said optical signal on said second surface wherein said optical signal has a wavelength, wherein a portion of said optical signal can pass through said second semiconductor layer but is absorbed by said first semiconductor material in said first semiconductor layer for collection by said device.

19. The opto-electronic system of claim 18 wherein said first semiconducting material comprises germanium and said second semiconducting material comprises silicon.

20. The opto-electronic system of claim 19 wherein said germanium containing layer is germanium or SiGe.

21. The opto-electronic system of claim 19 wherein the germanium concentration of said germanium layer is graded.

22. The opto-electronic system of claim 19 wherein said germanium containing layer has a thickness ranging from about 0.1 $\mu$m to about 1 $\mu$m.

23. The opto-electronic system of claim 19, wherein said germanium containing layer is also used to provide a base for a bipolar transistor.

24. The opto-electronic system of claim 18 wherein said device is selected from the group consisting of a P-N diode, a PIN diode, a Schottky diode and a transistor.

25. The opto-electronic system of claim 18 further comprising an integrated circuit chip wherein a plurality of said devices are distributed around said integrated circuit chip for simultaneously receiving said optical signal for optical clocking.

26. The opto-electronic system of claim 25 further comprising a plurality of integrated circuit chips, wherein each of said integrated circuit chips comprises said device and is configured to receive said optical signal for optical clocking.

27. The opto-electronic system of claim 25 further comprising a multi chip module containing said plurality of integrated circuit chips, wherein each of said integrated circuit chips comprises said device and is configured to receive said optical signal for optical clocking.

28. The opto-electronic system of claim 18 wherein said first semiconducting material comprises a lower bandgap than said second semiconducting material.

29. The opto-electronic system of claim 18 wherein said first semiconducting material comprises an amorphous material or a direct bandgap material and said second semiconducting material comprises a crystalline material or an indirect bandgap material.

30. A method for providing a signal comprising the steps of:
a) providing a first semiconducting material on a second semiconducting material;
b) providing a device in said first material for receiving an optical signal;

c) directing an optical signal to said second semiconducting material, said optical signal having a wavelength, wherein a portion of said optical signal passes through said second semiconducting material and is absorbed by said first semiconducting material, wherein said first semiconducting material has a higher absorption coefficient than said second semiconducting material when both said first semiconducting material and said second semiconducting material are undoped; and d) generating an electrical signal in said device based on said absorbed optical signal.

31. The method of claim 30 wherein said first material comprises a germanium containing layer and said second material comprises silicon.

32. The method of claim 31 wherein said germanium containing layer is SiGe or Ge.

33. The method of claim 32 wherein the germanium concentration of said SiGe is graded.

34. The method of claim 30 further comprising receiving said optical signal in a plurality of said devices in said first material.

35. The method of claim 30 wherein energy of said optical signal ranges from 0.66 eV to 1.12 um 1.12 eV.

36. The method of claim 30 wherein said device is selected from a P-N diode, a PIN diode, a Scottky diode and a transistor.

37. The method of claim 30 wherein said first material and said second material are part of an integrated circuit chip and wherein a plurality of said devices are distributed around said integrated circuit chip for simultaneously receiving said optical signal.

38. The method of claim 37 wherein said optical signal comprises an optical clock signal, and wherein said integrated circuit chip further comprises devices or circuits that use said clock signal.

39. The method of claim 37 further comprising a plurality of integrated circuit chips, wherein each of said integrated circuit chips comprises at least one of said devices configured to receive said optical signal.

40. The method of claim 39 further comprising a multi chip module containing said plurality of integrated circuit chips, wherein each of said integrated circuit chips comprises at least one of said devices and is configured to receive said optical signal.

41. The method of claim 30 wherein said first semiconducting material comprises a lower bandgap than said second semiconducting material.

42. The method of claim 30 wherein said first semiconducting material comprises an amorphous material or a direct bandgap material and said second semiconducting material comprises a crystalline material or an indirect bandgap material.

* * * * *